United States Patent
Yu et al.

(10) Patent No.: US 7,646,097 B2
(45) Date of Patent: Jan. 12, 2010

(54) BOND PADS AND METHODS FOR FABRICATING THE SAME

(75) Inventors: Chen-Hua Yu, Hsin-Chu (TW); Shwang-Ming Jeng, Hsin-Chu (TW); Yung-Cheng Lu, Taipei (TW); Huilin Chang, Hsin-Chu (TW); Ting-Yu Shen, Nantou (TW); Yichi Liao, Nantou (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 223 days.

(21) Appl. No.: 11/246,088

(22) Filed: Oct. 11, 2005

(65) Prior Publication Data

US 2007/0080460 A1    Apr. 12, 2007

(51) Int. Cl.
*H01L 23/48* (2006.01)
(52) U.S. Cl. ............................... 257/758; 257/E23.015
(58) Field of Classification Search .................. 257/772, 257/779, 758, 752, E23.015, E23.02, E23.023, 257/E23.079, 750, 784
See application file for complete search history.

(56) References Cited

U.S. PATENT DOCUMENTS

| 5,834,365 | A | 11/1998 | Ming-Tsung et al. |
| 6,350,680 | B1 | 2/2002 | Shih et al. |
| 6,413,863 | B1 | 7/2002 | Liu et al. |
| 7,148,575 | B2 * | 12/2006 | Matsubara ................... 257/774 |
| 2003/0011072 | A1 * | 1/2003 | Shinogi et al. ............... 257/737 |
| 2003/0074789 | A1 | 4/2003 | Chen et al. |
| 2004/0070042 | A1 | 4/2004 | Lee et al. |
| 2006/0076159 | A1 * | 4/2006 | Daubenspeck et al. ....... 174/261 |

* cited by examiner

*Primary Examiner*—Davienne Monbleau
*Assistant Examiner*—Hoa B Trinh
(74) *Attorney, Agent, or Firm*—Birch, Stewart, Kolasch & Birch, LLP

(57) ABSTRACT

Bond pads for semiconductor devices and method for fabricating the same are provided. A bond pad has a first passivation layer having a plurality of openings. A conductive layer which overlies the openings and portions of the first passivation layer, having a first portion overlying the first passivation layer and a second portion overlying the openings. A second passivation layer overlies the first passivation layer and covers edges of the conductive layer.

7 Claims, 4 Drawing Sheets

BOND PADS AND METHODS FOR FABRICATING THE SAME

BACKGROUND

The present invention relates to semiconductor fabrication, and in particular to bond pads and methods for fabricating the same.

In creating integrated circuit (IC) devices, the technology of interconnecting devices and device features is of great importance. Bond pads are frequently used for this purpose, it is a requirement in creating integrated circuit devices that simple and reliable bond pads can be produced.

After the fabrication process of an integrated circuit device is completed, it is usually installed into a package to be utilized on a printed circuit board (PCB) as part of a larger circuit. In order for the inner leads of the package to make electrical contact with the bonding pads of the IC devices, a metal bond is formed at the bond pad of the IC device with a lead extending to the inner lead of the package lead frame.

During formation of a bond, bond pad lift off may occur. This problem may result when a large heavy bond pad (e.g., an aluminum interconnect) is placed on top of layers of the IC device which have not formed a strong. bond with the underlying layers. During formation of the aluminum interconnect, it is common to form an underlying barrier layer of a material, such as titanium nitride. This barrier layer is utilized to prevent aluminum from spiking into any underlying conductive layers during later fabrication steps. The barrier layer, however, which is usually titanium nitride, does not form a strong adhesion to the oxide underlying the bond pad and may separate during the bonding process.

Therefore, an improved bond pad, whereby a bond may be formed at a bond pad which is resistant to layer separation from adjacent layers, is desired.

SUMMARY

Bond pads and methods for fabricating the same are provided. An exemplary embodiment of a bond pad comprises a first passivation layer having a plurality of openings. A conductive layer overlies the openings and portions of the first passivation layer, having a first portion overlying the first passivation layer and a second portion over the openings. A second passivation layer overlies the first passivation layer and covers edges of the conductive layer.

An embodiment of a method for fabricating bond pads comprises providing a dielectric layer with a plurality of conductive features formed therein. A first passivation layer is formed over the dielectric layer, wherein the first passivation layer has a plurality openings exposing at least one of the conductive features. A conductive layer is formed over the openings and portions of the first passivation layer, wherein the conductive layer has a first portion over the first passivation layer and a second portion over the openings. A second passivation layer is formed to overly the first passivation layer and covers edges of the conductive layer.

An embodiment of an integrated circuit device comprises a dielectric layer with a plurality of conductive features formed therein. A first passivation layer, having a plurality openings respectively exposing at least one of the conductive features, overlies the dielectric layer. A conductive layer overlying the openings and portions of the first passivation layer has a first portion over the first passivation layer and second portion over the openings to. electrically connect the conductive feature thereunder. A second passivation layer overlies the first passivation layer and covers edges of the conductive layer.

A detailed description is given in the following embodiments with reference to the accompanying drawings.

BRIEF DESCRIPTION OF THE DRAWINGS

The invention can be more fully understood by reading the subsequent detailed description and examples with reference made to the accompanying drawings, wherein.

DESCRIPTION

Bond pads and methods for fabricating the same will now be described here in greater detail. The invention can potentially prevent bond pads from peeling off and ensure bondability of a bond thereon. In some embodiments, this can be accomplished by forming a conductive layer over a passivation layer with a plurality of downward protrusions therethrough and a second passivation over the first passivation to thereby cover edges of the conductive layer.

Figure 1:
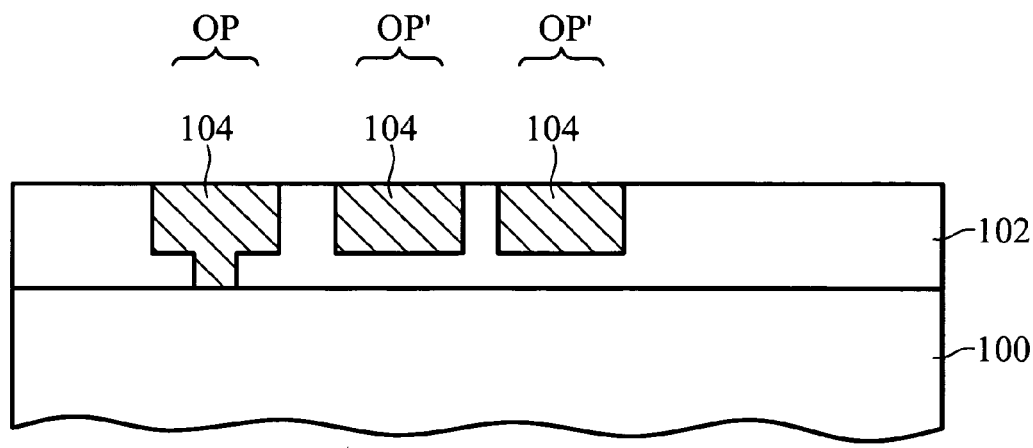
FIGS. 1 to 3 are schematic drawings illustrating steps of fabricating a bond pad according to an embodiment of the invention.
Figure 2:
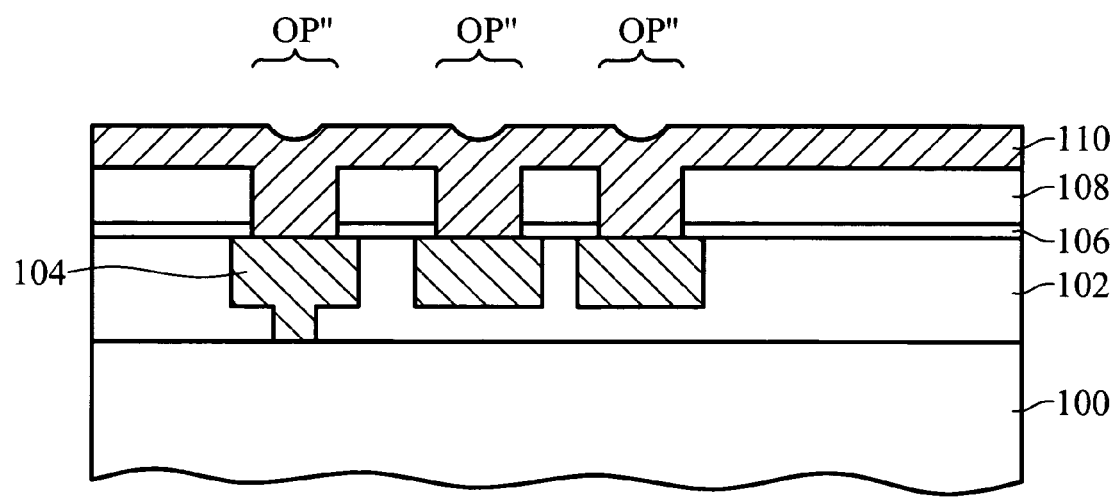
Figure 3:
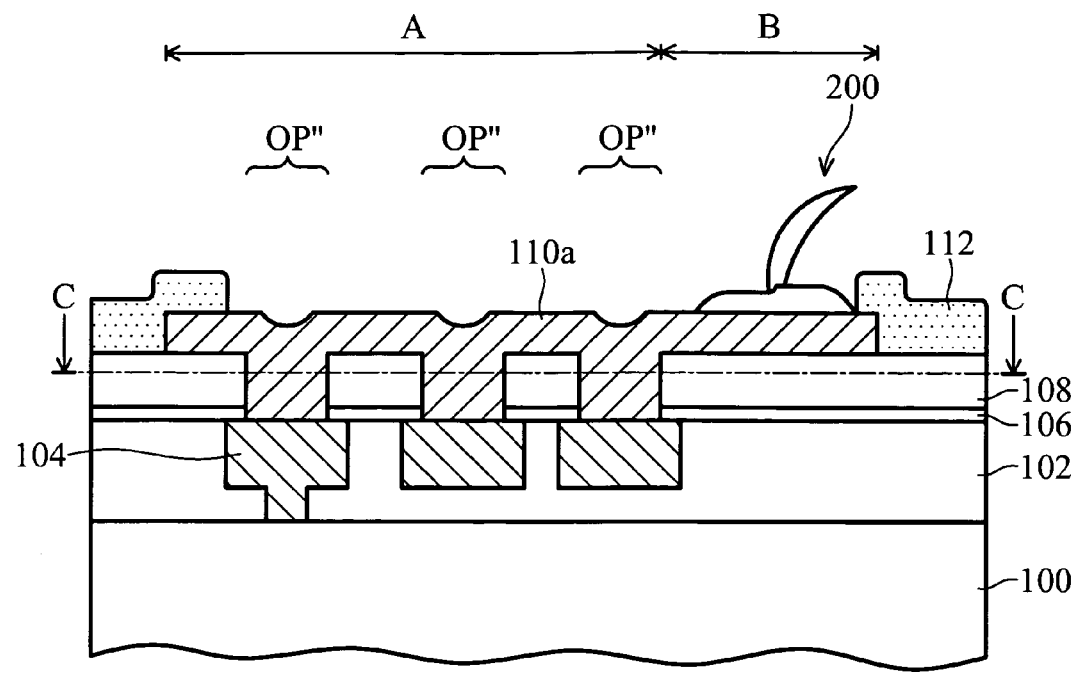

Referring to the drawings, FIGS. 1-3 are schematic diagrams illustrating steps of a method for fabricating a bond pad.

In FIG. 1, an integrated circuit (IC) structure 100 with conductive segments 104 formed thereon is provided. The IC structure 100 may comprise a semiconductor substrate (not shown) having semiconductor devices and multilayer interconnection structures formed thereon or merely a semiconductor substrate with stacked dielectric layers thereon. The semiconductor devices may be either active or passive devices formed on a semiconductor substrate, and the multilayer interconnection structures may be multiple metallization layers supported and spaced by inter-layer dielectric. The semiconductor devices and multi-layer interconnection structures that may be formed, however, are not shown in the integrated circuit structure 100 for simplicity.

The integrated circuit (IC) structure 100 having several metal segments 104 formed thereon is fabricated by the following steps. First, an inter-layer dielectric layer 102 is formed on the IC structure 100. Material of the inter-layer dielectric layer 102 may be oxide, nitride, polymers, spin-on glass (SOG), low-k dielectric, or combinations thereof. Preferably, the low-k dielectric are organic dielectrics such as benzocyclobutene. (BCB), SiLK, available from Dow Chemical, and Flare, available from Allied Signal of Morristown or of inorganic dielectrics of hydrogen silsesquioxane (HSQ), fluorocarbon silsesquioxane (FSQ), methylsilsesquioxane (MSQ), nanoglass, or similar. The inter-layer dielectric layer 102 may be formed using chemical vapor deposition (CVD) or spin-on coating, although other deposition techniques may be employed as well.

Next, openings OP and OP' are formed in the inter-layer dielectric layer 102 through, for example, conventional damascene techniques. The opening OP formed through the inter-layer dielectric layer 102 has an underlying via portion and an overlying trench portion. The opening OP may function as, for example, an opening for forming an interconnect via and an overlying conductive line. Herein, the openings OP' are merely formed in portions of the inter-layer dielectric layer 102 but not therethrough. The openings OP' may function as, for example, openings for forming conductive lines for signal transferring or pad redistribution.

Next, metal segments 104 are formed in the openings OP and OP'. The metal segments 104 may be formed by blanket deposition of a metal material over the inter-layer dielectric layer 102 filling the openings OP, OP'. The metal material may be, for example, tungsten, aluminum, copper or alloys thereof. The portion of metal material formed over the inter-layer dielectric layer 102 is then planarized by methods such as etching or chemical mechanical polishing (CMP), thus, the metal segments remain in the openings OP, OP' with a top surface thereof exposed.

In FIG. 2, a first passivation layer 108 is formed over the inter-layer dielectric layer 102 and covers the metal segments 104 therein. An optional etching stop layer 106 is formed between the first passivation layer 108 and the inter-layer dielectric layer 102 to provide suitable etch stop-wping capability.

The etching stop layer 106 may be, for example, silicon nitride (SiN), silicon carbide (SiC) or similar. The first passivation layer 108 may be, for example, silicon oxide (SiO), silicon oxynitride (SiON), or silicon nitride (SiN). The first passivation layer 108 and the etching stop layer 106 may be formed by, for example, or chemical vapor deposition (CVD).

The first passivation layer 108 and the etching stop layer 106 are then patterned to form a plurality of openings OP" at places relative to at least one of the metal segments 104 and thus expose a portion of the metal segment 104. Methods for patterning the first passivation layer 108 and the etching stop layer 106 may be dry etching such as plasma etching or the like.

Next, metal layer 110 is formed over the first passivation layer 108 and fills the openings OP". Here, the metal layer 110 may be aluminum or aluminum alloy such as an aluminum containing copper (AlCu) layer. The metal layer 110 is formed at a thickness of about 4000 Å to 20000 Å and may be formed by methods such as physical vapor deposition (PVD) or the like.

In FIG. 3, the metal layer 110 is then patterned to leave a pad 110a over the first passivation layer 108, having a first region A with a plurality of downward protrusions formed in the openings OP" and a second region B with a planar surface for forming sequential conductive bonding. Herein,. either the first region A or the second region B is capable of probe testing but the probe testing is preferably performed on the first region A.

Next, a second passivation layer 112 is formed over the first passivation layer 108 and the pad 110a and is then patterned to expose a portion of the pad 110a. Typically but not necessarily, the second passivation layer 112 and the first passivation layer 108 are formed of different materials. The first passivation layer 108 may be, for example, a layer of silicon oxide or silicon oxynitride and the second passivation. layer 112, for example, a layer of silicon nitride to provide topmost passivation. Normally, the second passivation layer 112 is formed at a thickness of about 2000-10000 Å. The second passivation layer 112 may be deposition (PECVD).

As shown in FIG. 3, the second passivation layer 112 covers edges of the pad 110a and thereby fixing the pad 111a and preventing peeling during sequential conductive bond bonding. Therefore, adhesion between the pad 110a and adjacent layers (i.e. the first passivation layer 108, the second passivation layer 112, the metal segments 114) is improved. In addition, the downward protrusions of the pad 110a formed in the openings OP" within the first passivation layer 108 also provide adhesion thereof in the first and the second passivation layers 108, 112. Thus, sequential conductive bond bonding, such as a wire bond 200 illustrated in FIG. 3 may be properly formed on the bond pad 110a in the second region B and ensuring reliability thereof.

Figure 4:
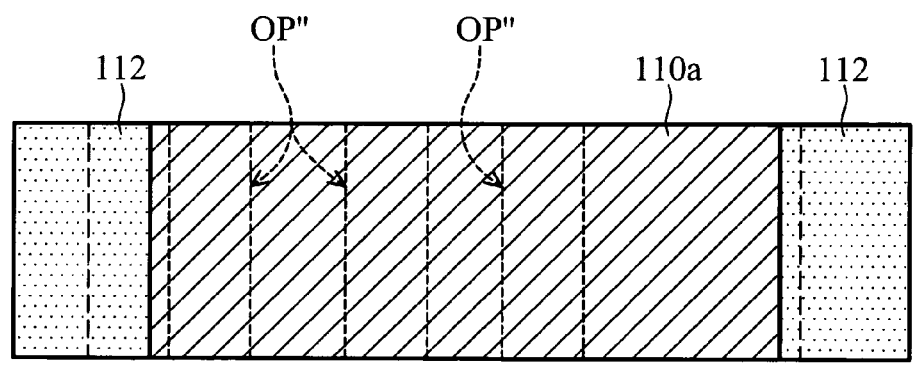
FIGS. 4-6 are schematic diagrams showing top views of a bond pad according to the invention.
Figure 5:
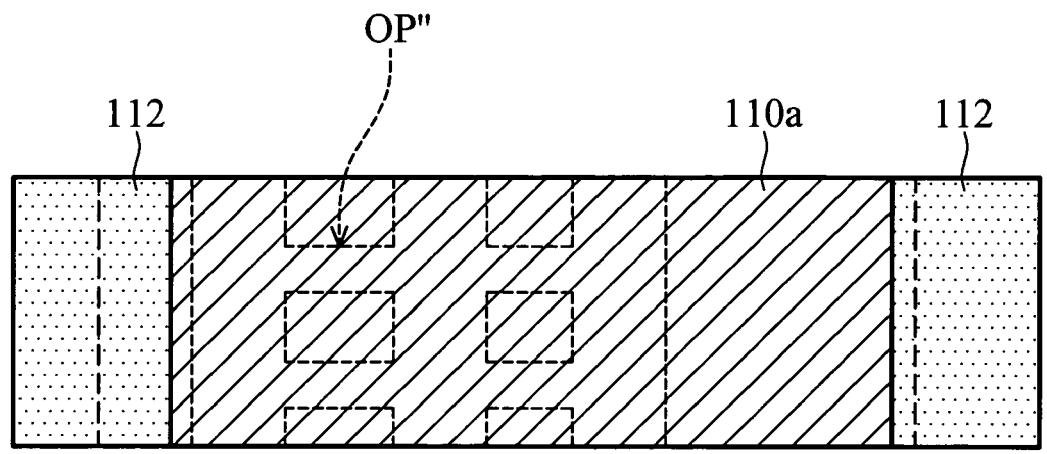
Figure 6:
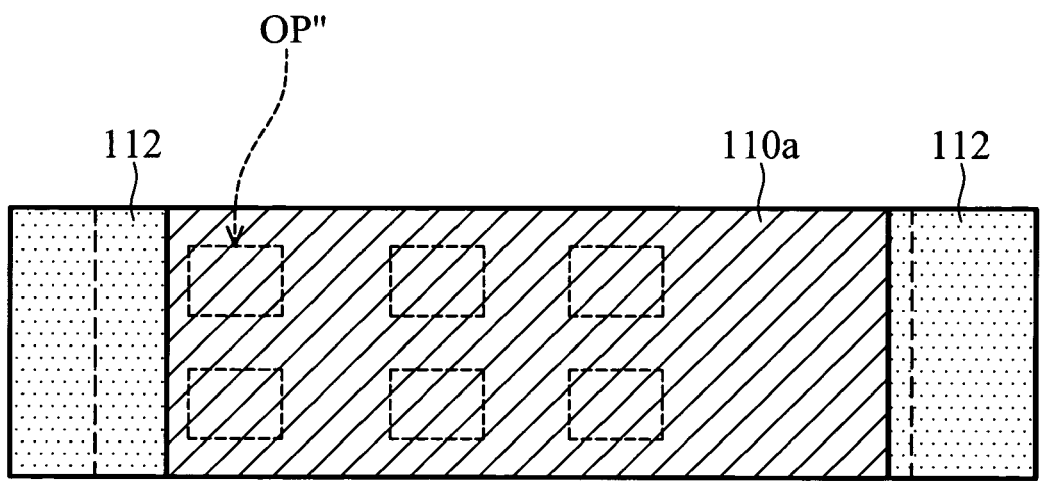

FIGS. 4-6 are schematic diagrams showing various top views taken along the line C-C of the bond pad structure illustrated in FIG. 3, wherein the wire bond 200 is omitted and not shown for simplicity. As shown in FIG. 4, the openings OP" are formed in parallel slot patterns and the bond pad structure is formed in a rectangular shape. In FIG. 5, the openings OP" are formed in a grid pattern and the bond pad structure is formed in a rectangular shape. In FIG. 6, the openings OP" is formed in a mesh pattern and the bond pad structure is formed in a rectangular shape.

Figure 7:
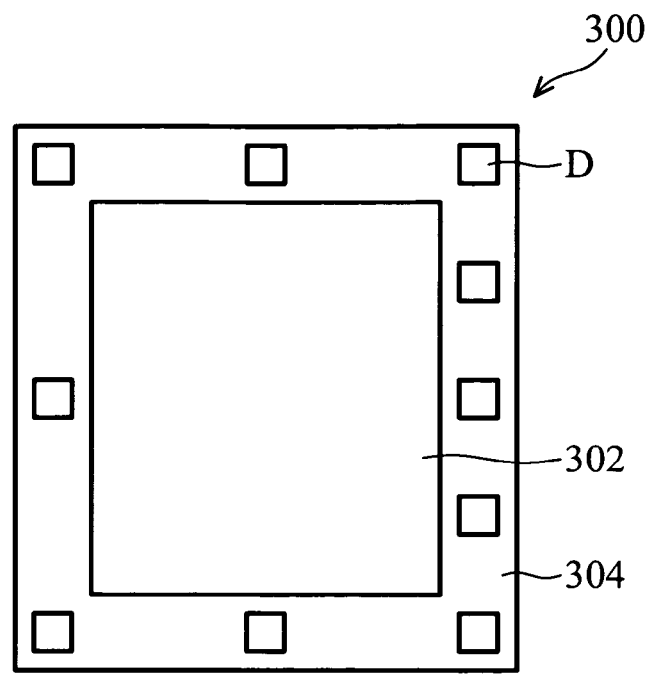
FIGS. 7-8 are schematic diagrams showing arrangements of a bond pad over an integrated circuit (IC) device according to the invention.
Figure 8:
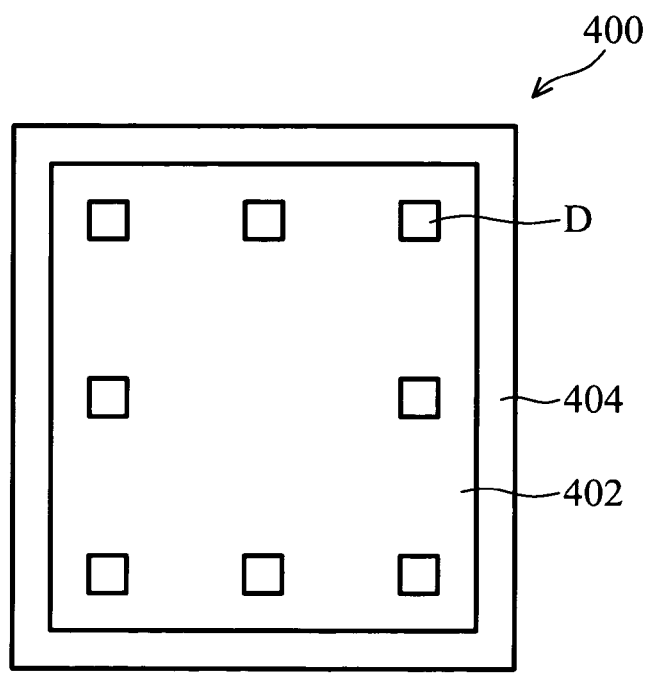

FIGS. 7-8 are schematic diagrams showing various arrangements of the bond pad structure (titled as D here) illustrated in FIG. 3 over an integrated circuit chip 300. In FIG. 7, the IC chip 300 is provided with a plurality of bond pad structures D formed in various locations of a peripheral region 304 where has no semiconductor device formed thereunder. The semiconductor devices are mainly formed in a device region 302 of the IC chip 300. Therefore, semiconductor devices within the IC chip 300 can be prevented from damage during conductive bond bonding over the bond pad structure D and reliability of the IC chip 300 is ensured.

Moreover, FIG. 8 illustrate an IC device 400 provided with a plurality of bond pad structures D formed within a device region 402 thereof since no semiconductor devices or conductive lines exist in the two underlying layers below the region for conductive bond bonding (e.g. the second region B in FIG. 3) Therefore, the surface area of the device region 402 of the IC chip 400 is enlarged and surface area of a peripheral region 404 surrounding the device region 402 is reduced. Therefore, device integration of the IC chip 400 is thereby increased.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A bond pad, comprising:
   a first passivation layer having a plurality of openings;
   a conductive layer overlying the openings and portions of the first passivation layer, having a first portion overlying the first passivation layer and a second portion overlying and filling the openings, wherein the first portion is for conductive bonding and the second portion is for probe testing, the second portion of the conductive layer is formed with an uneven top surface having a plurality of downward protrusions formed completely through the first passivation layer, and the first portion of the conductive layer is formed with a planar surface having no downward protrusions formed completely through the first passivation layer;
   a conductive bond formed on the first portion of the conductive layer but not on the second portion of the conductive layer; and
   a second passivation layer overlying the first passivation layer and covering edges of the conductive layer, wherein none of the downward protrusions of the conductive layer formed through the first passivation layer is covered by the second passivation layer.

2. The bond pad of claim 1, wherein the conductive layer comprises aluminum copper (AlCu).

3. The bond pad of claim 1, wherein the second passivation layer comprises nitride, oxide, oxynitride, or combinations thereof.

4. The bond pad of claim 1, wherein the conductive layer exposed by the second passivation layer has a substantially rectangular shape.

5. The bond pad of claim 4, wherein the openings are formed in slot patterns.

6. The bond pad of claim 4, wherein the openings are formed in grid patterns.

7. The bond pad of claim 4, wherein the openings are formed in mesh patterns.

\* \* \* \* \*